(12) United States Patent
Kushnir

(10) Patent No.: US 10,944,409 B2
(45) Date of Patent: Mar. 9, 2021

(54) PHASE-LOCKED LOOP AND METHOD FOR THE SAME

(71) Applicant: INTEL IP CORPORATION, Santa Clara, CA (US)

(72) Inventor: Igal Kushnir, Hod-Hasharon (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/618,420

(22) PCT Filed: Jul. 24, 2017

(86) PCT No.: PCT/US2017/043436
§ 371 (c)(1),
(2) Date: Dec. 2, 2019

(87) PCT Pub. No.: WO2019/022695
PCT Pub. Date: Jan. 31, 2019

(65) Prior Publication Data
US 2020/0235744 A1  Jul. 23, 2020

(51) Int. Cl.
*H03L 7/093* (2006.01)
*G04F 10/00* (2006.01)
*H03L 7/091* (2006.01)
*H03L 7/099* (2006.01)
*H04B 1/04* (2006.01)
*H04B 1/16* (2006.01)

(52) U.S. Cl.
CPC .......... *H03L 7/093* (2013.01); *G04F 10/005* (2013.01); *H03L 7/091* (2013.01); *H03L 7/0992* (2013.01); *H03L 7/0997* (2013.01); *H04B 1/04* (2013.01); *H04B 1/16* (2013.01)

(58) Field of Classification Search
CPC ... H03L 2207/50; H03L 7/093; H03L 7/0992; H03L 7/091; H03L 7/0997; G04F 10/005; H04B 1/04; H04B 1/16
See application file for complete search history.

(56) References Cited

U.S. PATENT DOCUMENTS

| | | |
|---|---|---|
| 7,737,743 B1 | 6/2010 | Gao et al. |
| 2009/0206892 A1 | 8/2009 | Li |
| 2009/0231050 A1 | 9/2009 | Lin |
| 2011/0133799 A1 | 6/2011 | Dunworth et al. |
| 2013/0002317 A1 | 1/2013 | Frantzeskakis et al. |
| 2013/0033293 A1* | 2/2013 | Zhang .................. H03L 7/1976 327/156 |

(Continued)

*Primary Examiner* — Sung S Ahn
(74) *Attorney, Agent, or Firm* — 2SPL Patent Attorneys PartG mbB; Yong Beom Hwang

(57) ABSTRACT

A phase-locked loop is provided. The phase-locked loop includes a first loop including a con-trolled oscillator and a phase detector. The controlled oscillator is configured to generate an oscillation signal. The phase detector is configured to generate first signal indicative of a timing difference between a reference signal and the oscillation signal. Further, the phase-locked-loop includes a second loop configured to generate a second signal indicative of a timing error of the oscillation signal's cycle time, and to generate a correction signal based on the second signal. The phase-locked loop additionally includes a combiner configured to generate a control signal for the controlled oscillator by combining the correction signal and a third signal derived from the first signal.

23 Claims, 8 Drawing Sheets

(56) References Cited

U.S. PATENT DOCUMENTS

| | | | |
|---|---|---|---|
| 2014/0021992 A1* | 1/2014 | Frantzeskakis | H03L 7/18 327/159 |
| 2014/0241467 A1 | 8/2014 | Huang et al. | |
| 2015/0145567 A1* | 5/2015 | Perrott | G04F 10/005 327/156 |
| 2016/0126960 A1 | 5/2016 | Whatmough et al. | |

* cited by examiner

700

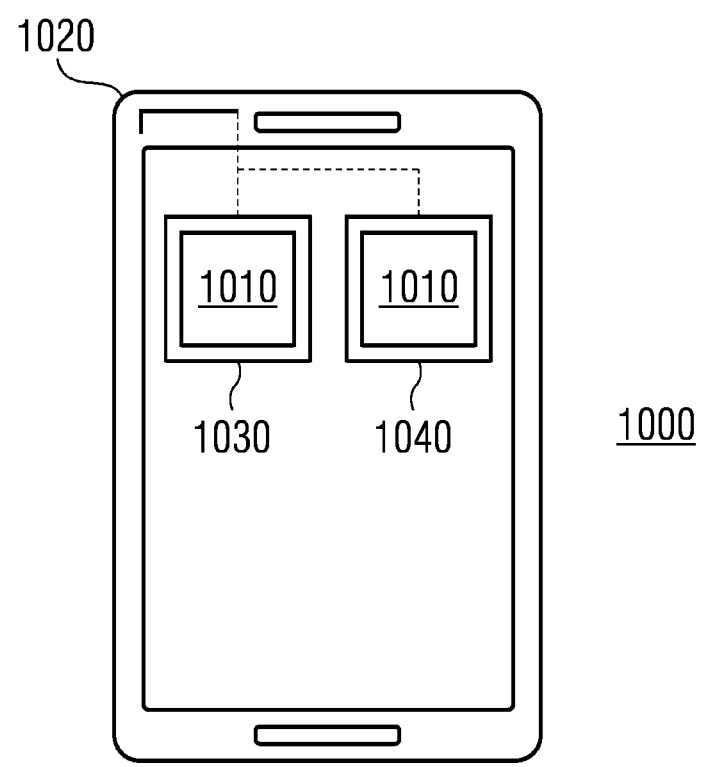

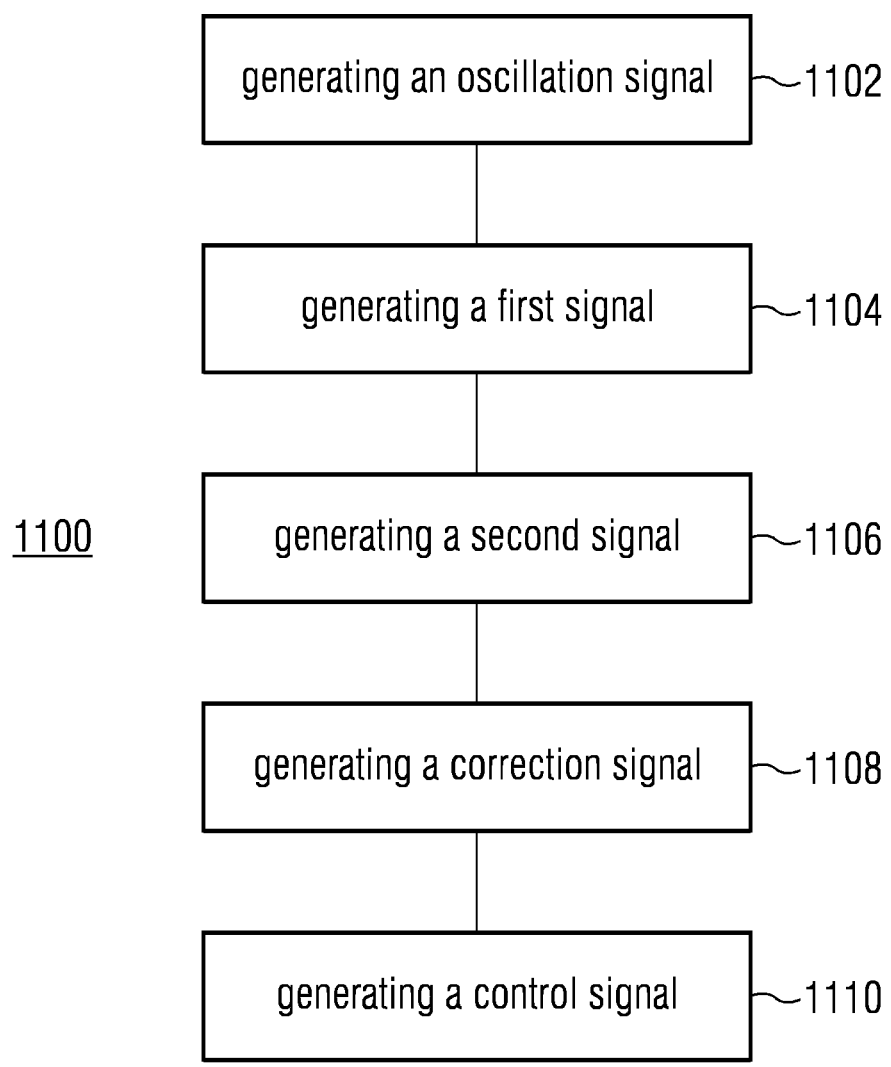

PHASE-LOCKED LOOP AND METHOD FOR THE SAME

FIELD

Examples relate to an analog or digital Phase-Locked Loop (PLL), and a method for the same.

BACKGROUND

In a conventional PLL (e.g. an analog or Digital PLL, DPLL), the phase noise is determined by the components of the PLL (e.g. Voltage Controlled Oscillator, VCO; Digitally Controlled Oscillator, DCO; phase detector such as a Time-to-Digital Converter, TDC) and the phase noise of the reference frequency.

In a transmitter, the phase noise of the PLL affects the Error Vector Magnitude (EVM) of the transmit signal and the receive signal. Hence, there is a high motivation to improve the PLL's phase noise.

Conventionally, it is attempted to improve the phase noise of the PLL by improving the phase noise of its basic components (e.g. DCO, TDC or reference frequency source). In some cases, it is simply not practical or possible further improve the phase noise of the PLL's basic components. Further, the improvement of the phase noise behavior of the basic components usually leads to higher costs and power consumption.

Hence, there may be a desire for improved phase noise reduction within PLLs.

BRIEF DESCRIPTION OF THE FIGURES

Some examples of apparatuses and/or methods will be described in the following by way of example only, and with reference to the accompanying figures, in which

FIG. 10 illustrates an example of a mobile device comprising a PLL; and

FIG. 11 illustrates a flowchart of an example of a method for a PLL.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
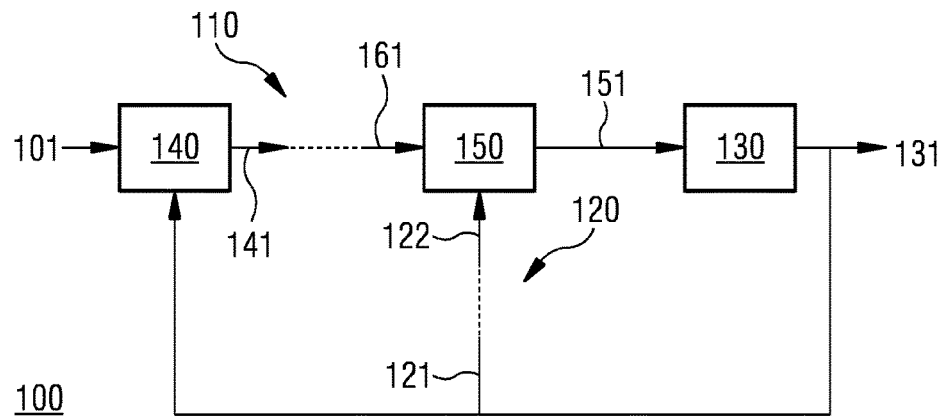
FIG. 1 illustrates an example of a PLL.

FIG. 1 illustrates a PLL 100. The PLL 100 comprises a first loop 110 comprising a controlled oscillator 130 and a phase detector 140. The controlled oscillator 130 is configured to generate an oscillation signal 131. The phase detector 140 is configured to generate a first signal 141 indicative of a timing difference between a reference signal 101 and the oscillation signal 131. Further, the PLL 100 comprises a second loop 120 configured to generate a second signal 121 indicative of a timing error of the oscillation signal's cycle time, and to generate a correction signal 122 based on the second signal 121. The PLL 100 additionally comprises a combiner 150 configured to generate a control signal 151 for the controlled oscillator 130 by combining the correction signal 122 and a third signal 161 derived from the first signal 131.

The PLL 100 comprises the additional second loop 120 in order to enable phase noise cancellation with high accuracy compared to conventional PLLs. With the controlled oscillator 130 generating the oscillation signal 131 based on the control signal 151, the phase noise of the PLL 100 may be compensated by adjusting the control signal 151 via the correction signal 122. Hence, the second loop 120 may allow to improve the phase noise of the PLL 100 without improving the phase noise behavior of the basic components of the PLL 100 (i.e. without improving the phase noise behavior of the first loop 110). The additional second loop 120 may, hence, enable the PLL 100 to operate with reduced power consumption and improved phase compared to PLLs with conventional phase noise reduction. Furthermore, the proposed phase noise cancellation may be achieved without increasing the required chip area of the PLL and without increasing the manufacturing costs compared to conventional PLLs.

The PLL 100 may be an analog PLL as well as a DPLL. Accordingly, the phase detector 140 and the controlled oscillator 130 may be analog or digital components. For example, the phase detector 140 may be a TDC. The controlled oscillator may be a VCO or a DCO.

A frequency of the oscillation signal 131 may range from a few Hz to several tens or even hundreds of GHz.

The first loop 110 may additionally comprise further elements of a conventional PLL. For example, the first loop 110 may additionally comprise a frequency divider (feedback divider) coupled between an output of the controlled oscillator 130 and the phase detector 140. Also, the first loop 110 may further comprises a loop filter configured to generate the third signal 161 by (loop) filtering the first signal 131.

The second loop 120 estimates the timing error of the oscillation signal's cycle time, i.e. the difference between the oscillation signal's actual cycle time and the oscillation signal's nominal (reference) cycle time. Therefore, the second loop 120 may comprise a TDC (not illustrated) configured to generate, based on the oscillation signal 131 and a delayed replica of the oscillation signal 131, a fourth signal indicative of the oscillation signal's actual cycle time.

The delayed replica of the oscillation signal 131 may be generated by a delay element of the second loop 120 which is configured to delay the oscillation signal 131 (by a predefined delay time, the predefined delay time may be adjustable).

A sampling frequency of the TDC may be substantially equal to the oscillation frequency of the oscillation signal 131 in some examples. However, the sampling frequency of the TDC may also be way lower than the oscillation frequency of the oscillation signal 131. For example, the sampling frequency of the TDC may be 20 times or more lower than the oscillation frequency of the oscillation signal 131. Although the oscillation frequency of the oscillation signal 131 may be very high (GHz range), the TDC may be operated at a low duty cycle (e.g. sampling/gating rate between 40 and 100 MHz) since most of the phase noise power density is below 10 MHz. Accordingly, the phase noise estimation by the TDC may consume only little power.

The second loop 120 may further comprise a second combiner (not illustrated) configured to generate the second signal 121 by combining the fourth signal output by the TDC and a fifth signal indicative of a nominal cycle time of the oscillation signal 131. The fifth signal may be generated in many different ways. For example, the fifth signal may be based on a mean output of the TDC over a predetermined number of oscillation cycles of the oscillation signal 131. The phase noise cancels out over the number of oscillation cycles, so that the mean output of the TDC indicates the TDC output for the nominal cycle time of the oscillation signal 131. Alternatively, a reference output of the TDC for each oscillation frequency of the oscillation signal 131 may be determined in a calibration.

Also different approaches may be used for generating the correction signal 122 from the second signal 121. For example, the second loop 120 may comprise an integrator (not illustrated) configured to generate the correction signal 122 by continuously integrating the second signal 121. Accordingly, the estimated timing errors of the oscillation signal's cycle time is continuously summed up.

Alternatively, the second loop 120 may comprise a third combiner configured to generate a sample of the correction signal 122 by combining the second signal 121 with a prior sample of the correction signal 122. For example, a second delay element may be coupled between an output and an input of the third combiner so that the second delay element delays the prior sample of the correction signal 122 such that it may be combined with a current (succeeding) sample of the second signal 121.

Additionally, the second loop 120 may comprise a filter configured to band-pass filter the correction signal 122. Accordingly, the correction signal 122 may be band-pass filtered in order to limit the bandwidth of the correction signal 122. This may allow to improve the phase noise cancellation within the PLL 100. For example, the filter may be configured to low-pass filter the correction signal 122. Accordingly, high frequency components of the correction signal 122 may be removed. This may allow improved phase noise attenuation within the PLL 100.

In the following a plurality of more detailed implementation examples of the PLL 100 as schematically illustrated in FIG. 1 will be discussed in connection with FIGS. 2 to 7.

Figure 2:
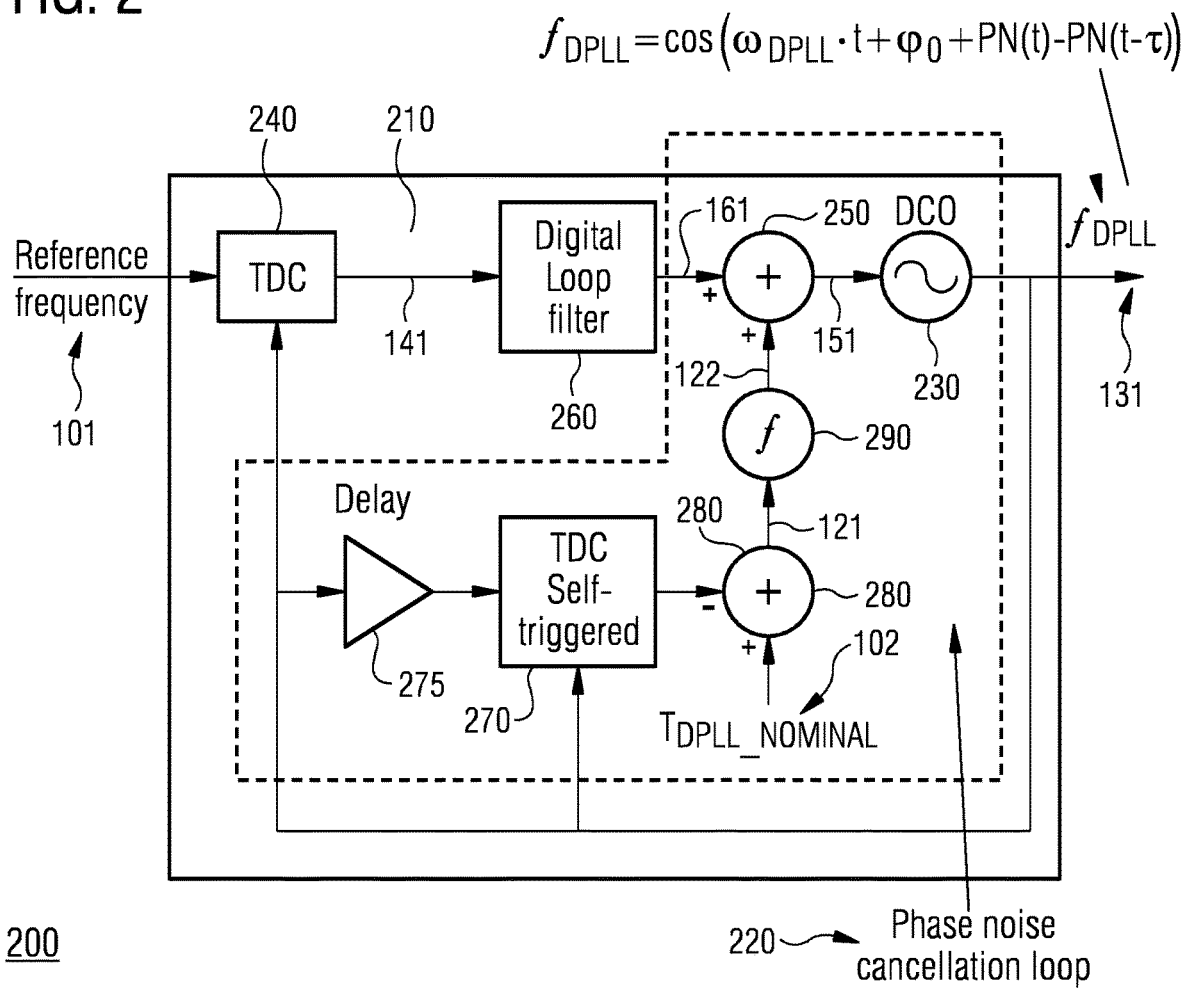
FIG. 2 illustrates another example of a PLL.

FIG. 2 illustrates further PLL 200 which is implemented as DPLL. The PLL 200 comprises a first loop 210 with a DCO 230 as controlled oscillator, a TDC 240 as phase detector, and a digital loop filter 260.

At first, the second loop 220 for compensating the phase noise of the PLL 200 is neglected. Then, the output frequency of the DPLL, i.e. the oscillation frequency of the oscillation signal 131 is:

$$f_{DPLL}(t) = \cos(\omega_{DPLL} \cdot t + \varphi_0 + PN(t)) \tag{1},$$

with $\omega_{DPLL}$ denoting the angular frequency, $\varphi_0$ denoting a phase constant, and PN(t) denoting the phase noise of the PLL 200.

Hence, the instantaneous phase $\Theta_{inst}$ of the PLL 200, i.e. the oscillation signal 131 is:

$$\Theta_{inst} = \omega_{DPLL} \cdot t + \varphi_0 + PN(t) \tag{2},$$

and the instantaneous DCO cycle time $T_{DPLL\_inst}$, i.e., the cycle time of the oscillation signal 131 is:

$$T_{DPLL\_inst} = T_{DPLL\_nominal} + \Delta T_{PN}(t) \tag{3},$$

with $T_{DPLL\_nominal}$ denoting the nominal PLL cycle time (i.e. the nominal cycle time of the oscillation signal 131), and $\Delta T_{PN}(t)$ denoting the phase noise timing error (i.e. the timing error of the oscillation signal 131's cycle time) which is different for each oscillation cycle of the oscillation signal 131 (i.e. each DCO cyle).

Using the proposed architecture, the DCO timing error $\Delta T_{PN}(t)$ is measured and subtracted from the DCO output. Therefore, the PLL 200 comprises in addition to the first loop 210 (which is a regular DPLL) the second loop 220, i.e. a phase noise cancellation loop. Accordingly, the PLL 200 has two loops: the basic DPLL loop 210, which is slow and controls the accuracy of the DPLL output frequency (since it is locked to the reference frequency 101), and the second fast internal loop 220 for phase noise cancellation.

The second loop 220 comprises the TDC 270. The TDC 270 receives the oscillation signal 131 and a delayed replica of the oscillation signal 131 (which is provided by the delay element 275 based on the oscillation signal 131) as input. Hence, the TDC 270 is self-triggered. Since the TDC 270 is self-triggered, the measurement is not affected by any external phase noise (e.g. from a reference source providing the reference signal).

Figure 3:
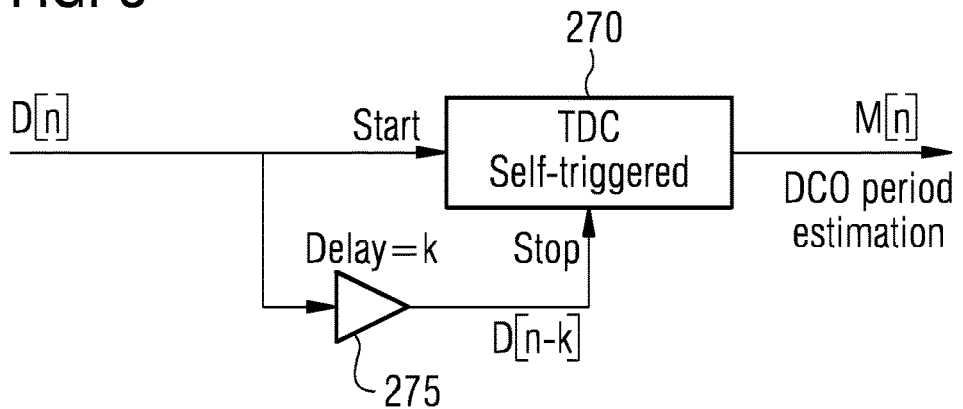
FIG. 3 illustrates an example of a self-triggered TDC.

A more detailed view of the self-triggered TDC 270 is illustrated in FIG. 3. An oscillation cycle D[n] of the oscillation signal 131 is a first input for the TDC 270. The oscillation cycle D[n] is further delayed by k TDC cycles via the delay element 275. The delayed oscillation cycle D[n-k] is a second input for the TDC 270.

Figure 5:
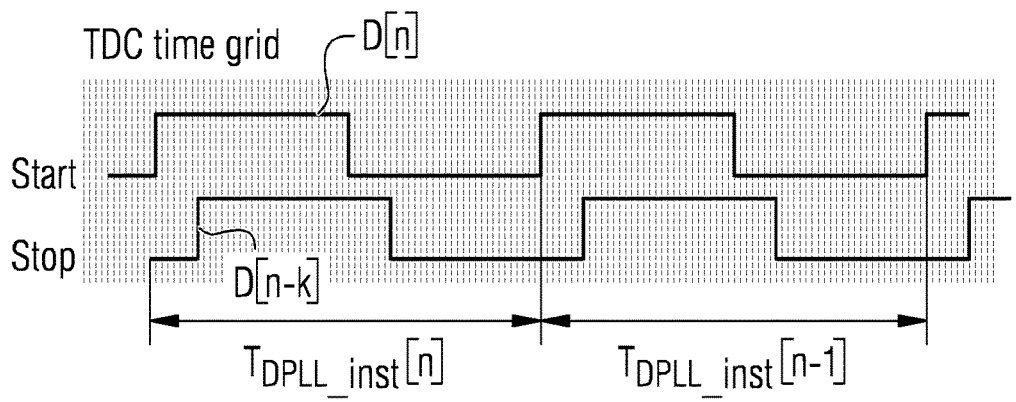
FIG. 5 illustrates examples of an oscillation signal and its delayed replica input to the self-triggered TDC.

An example of the oscillation cycle D[n] of the oscillation signal 131 and the delayed oscillation cycle D[n-k] is illustrated in FIG. 5. The shape of the oscillation cycle D[n] and the delayed oscillation cycle D[n-k] is substantially equal—only shifted by the k TDC cycles. FIG. 5 further illustrates the fine grid of TDC 270, which allows to determine the actual cycle time of the oscillation signal 131 with high accuracy.

Based on the two above quantities, the TDC 270 outputs an estimate M[n] of the DCO period, i.e. the actual cycle time of the oscillation signal 131.

Figure 4:
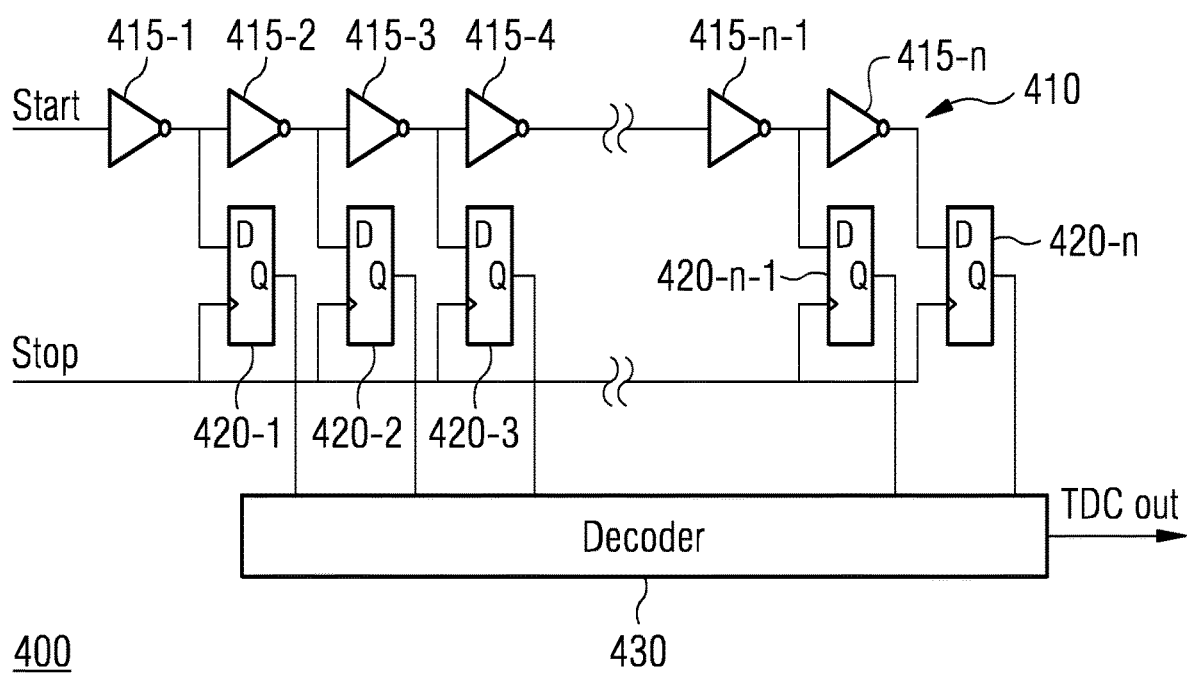
FIG. 4 illustrates an example of a flash TDC implementation of the self-triggered TDC of FIG. 3.

An exemplary implementation of the TDC 270 as flash TDC 470 is illustrated in FIG. 4. The flash TDC 470 comprises a delay line 410 with a plurality of delay elements 415-1, 415-2, . . . , 415-n. The plurality of delay elements 415-1, 415-2, . . . , 415-n iteratively delay the oscillation cycle D[n] of the oscillation signal 131 in order to generate delayed oscillation cycles of the oscillation signal 131.

Further, the flash TDC 470 comprises a plurality of flip-flop circuits 420-1, 420-2, . . . , 420-n. Each of the plurality of flip-flop circuits 420-1, 420-2, . . . , 420-n receives the delayed oscillation cycle D[n-k] and one of the delayed oscillation cycles of the oscillation signal 131.

The plurality of flip-flop circuits 420-1, 420-2, . . . , 420-n output binary values based on the respective time difference between the delayed oscillation cycle D[n-k] and one of the delayed oscillation cycles of the oscillation signal 131. These binary values are supplied to a decoder 430 which is configured to generate an output signal indicative of the actual cycle time of the oscillation signal 131.

Instead of one single flip-flop circuit per delay element, also a plurality of flip-flop circuits may be used, respectively. Accordingly, a stochastic flash TDC is provided which may further increase the time resolution of the TDC.

However, it is to be noted that the TDC 270 illustrated in FIGS. 2 and 3 is not illustrated to a flash TDC. In general, any TDC technology (architecture) may be used for the TDC 270.

As indicated above, the sampling frequency of the TDC 270 may be substantially equal to the oscillation frequency of the oscillation signal 131, or way below in order to enable low power consumption of the TDC 270.

Referring back to FIG. 2, the second loop 220 further comprises a combiner 280 (e.g. an adder) which combines the TDC output signal with a further signal 102 indicate of the nominal cycle time of the oscillation signal 131 in order to generate a signal 121 indicative of the timing error of the oscillation signal 131's cycle time.

This signal is then continuously integrated by the integrator 290 in order to generate the correction signal 122.

The combiner (adder) 250 combines the output signal 161 of the loop filter 260 with the correction signal 122 in order to generate the control signal 151 for the DCO 250.

Combing the first (regular) DPLL 210 and the second phase noise cancellation loop 220 yields the following DCO cycle time, i.e. actual cycle time of the oscillation signal 131:

$$T_{DPLL\_inst} = T_{DPLL\_nominal} + \Delta T_{PN}(t) - \Delta T_{PN}(t-\tau) + \Delta T_{TDC\_Q}(t) \quad (4),$$

with $\Delta T_{PN}(t-\tau)$ denoting the delayed phase noise timing error (i.e. the delayed timing error of the oscillation signal 131's cycle time), $\tau$ denoting the phase noise cancellation delay (i.e. the delay of the second loop 220), and $\Delta T_{TDC\_Q}(t)$ denoting the quantization error of the self-triggered TDC 270.

It is evident from expression (4) that the effectivity of the phase noise cancellation is not determined by the level of the phase noise (in the first loop 210), but rather by the quantization of the self-triggered TDC 270 and the delay of the phase noise cancellation loop 220.

Based on expression (4), the output frequency of the DPLL, i.e. the oscillation frequency of the oscillation signal 131, is the following:

$$f_{DPLL}(t) = \cos(\omega_{DPLL} \cdot t + \varphi_0 + PN(t) - PN(t-\tau) + PN_{TDC\_Q}(t)) \quad (5),$$

with PN(t-τ) denoting the delayed estimation of the DPLL's phase noise (i.e. the delayed phase noise of the first loop 210), and $PN_{TDC\_Q}(t)$ denoting the phase noise due to the quantization error of the self-triggered TDC 270.

This corresponds to filtering the phase noise by a high-pass filter:

$$PN(t) - PN(t-\tau) + PN_{TDC\_Q}(t) = PN(t) \cdot (\delta(t) - \delta(t-\tau)) + PN_{TDC\_Q}(t) = PN(t) * h(t,\tau) + PN_{TDC\_Q}(t) \quad (6)$$

$$\Im\{h(t,\tau)\} = H(f,\tau) = 1 - e^{-j2\pi f\tau} \quad (7)$$

The magnitude of this filter is given by:

$$|H(f,\tau)|^2 = |1 - e^{-j2\pi f\tau}|^2 = 2 \cdot (1 - \cos(2\pi f\tau)) \quad (8)$$

Figure 8:
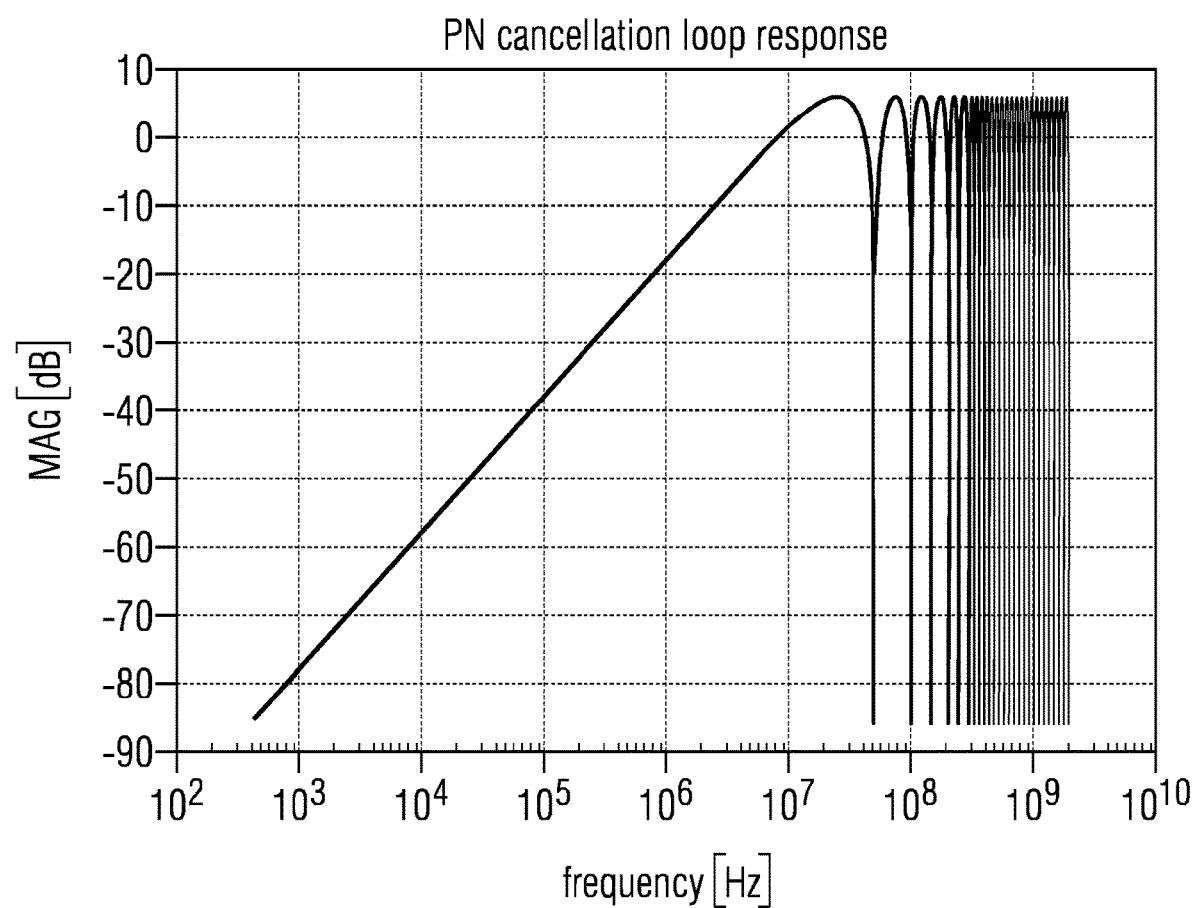
FIG. 8 illustrates an example of phase noise attenuation over frequency.

An exemplary filter response is illustrated in FIG. 8. FIG. 8 illustrates the phase noise attenuation over oscillation frequency of the oscillation frequency. In the example of FIG. 8, a phase noise cancellation delay (i.e. the delay of the second loop 220) of τ=20 ns was assumed. It is evident from FIG. 8, that high attenuation is achieved for frequencies below 1 MHz, which is the bandwidth of the DPLL (i.e. the first loop 210).

The spectral density of the PLL's phase noise $S_\theta(f)$ (i.e. the spectral density of the phase noise of the oscillation signal 131) is given by:

$$S_\theta(f) = S_{PN}(f) \cdot |1 - e^{-j2\pi f\tau}|^2 + S_{TDC_Q}(f) = 2 \cdot S_{PN}(f) \cdot (1 - \cos(2\pi f\tau)) + S_{TDC\_Q}(f) \quad (9),$$

with $S_{PN}(f)$ denoting the spectral density of the phase noise of the PLL 200 without the second loop 220, and $S_{TDC\_Q}(f)$ denoting the spectral density of the phase noise caused by the quantization error of the self-triggered TDC 270.

Figure 9:
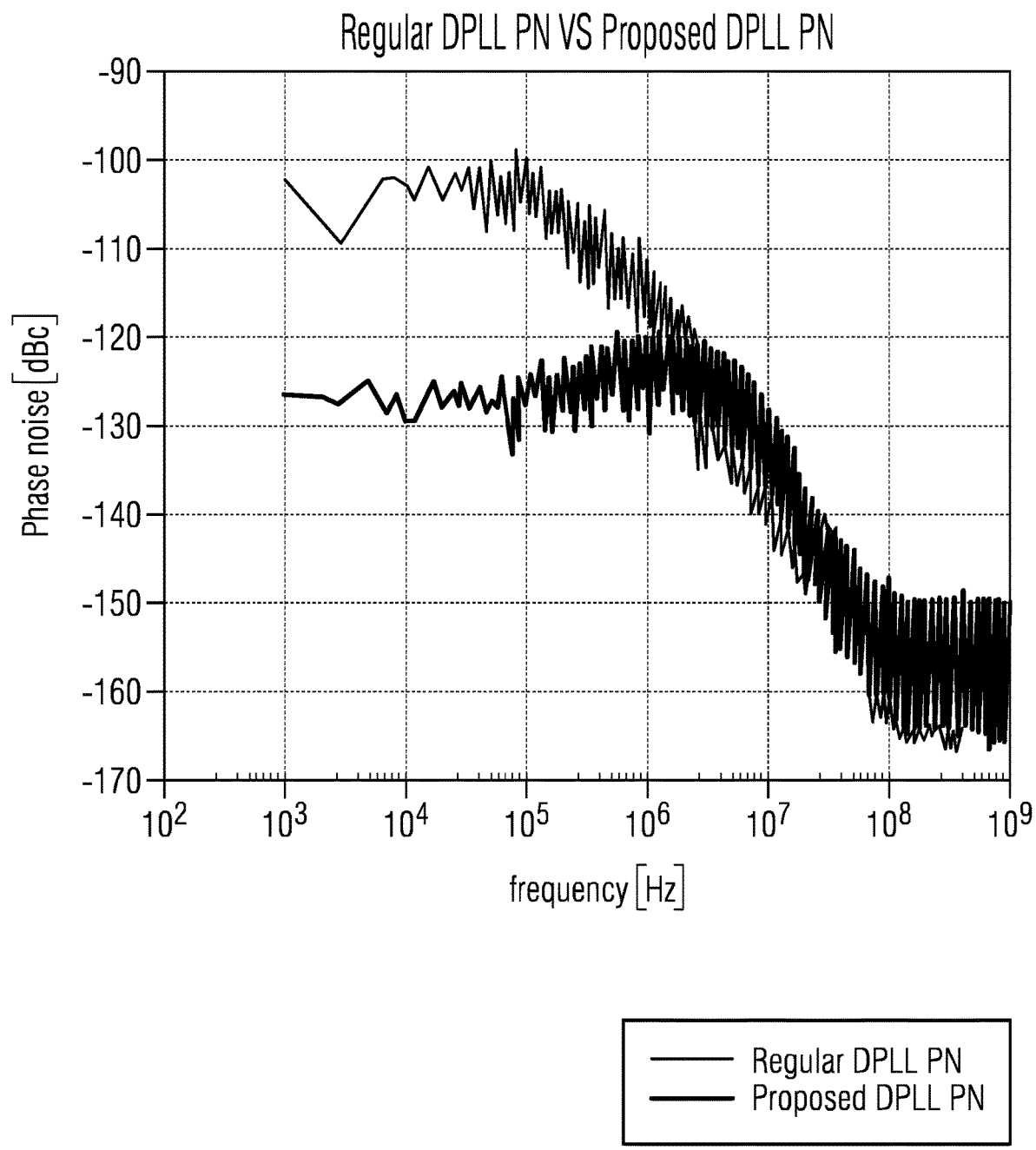
FIG. 9 illustrates an example of a comparison between a conventional PLL and a PLL according to the proposed architecture.

The resulting phase noise of the PLL is illustrated in FIG. 9 by line 910. As a reference, the phase noise of a conventional PLL is further illustrated by line 920. It is evident from FIG. 9 that the phase noise is heavily reduced (approx. by 20 dBc) for frequencies below 1 MHz, i.e. for frequencies below the bandwidth of the first loop. In this region, the phase noise of the PLL is mainly due to the quantization error of the self-triggered TDC 270. For higher frequencies, the phase noise is substantially equal to the one of the conventional PLL. This is due to the phase noise cancellation delay. In order to achieve better phase noise cancellation, the phase noise cancellation delay needs to be reduced.

Figure 6:
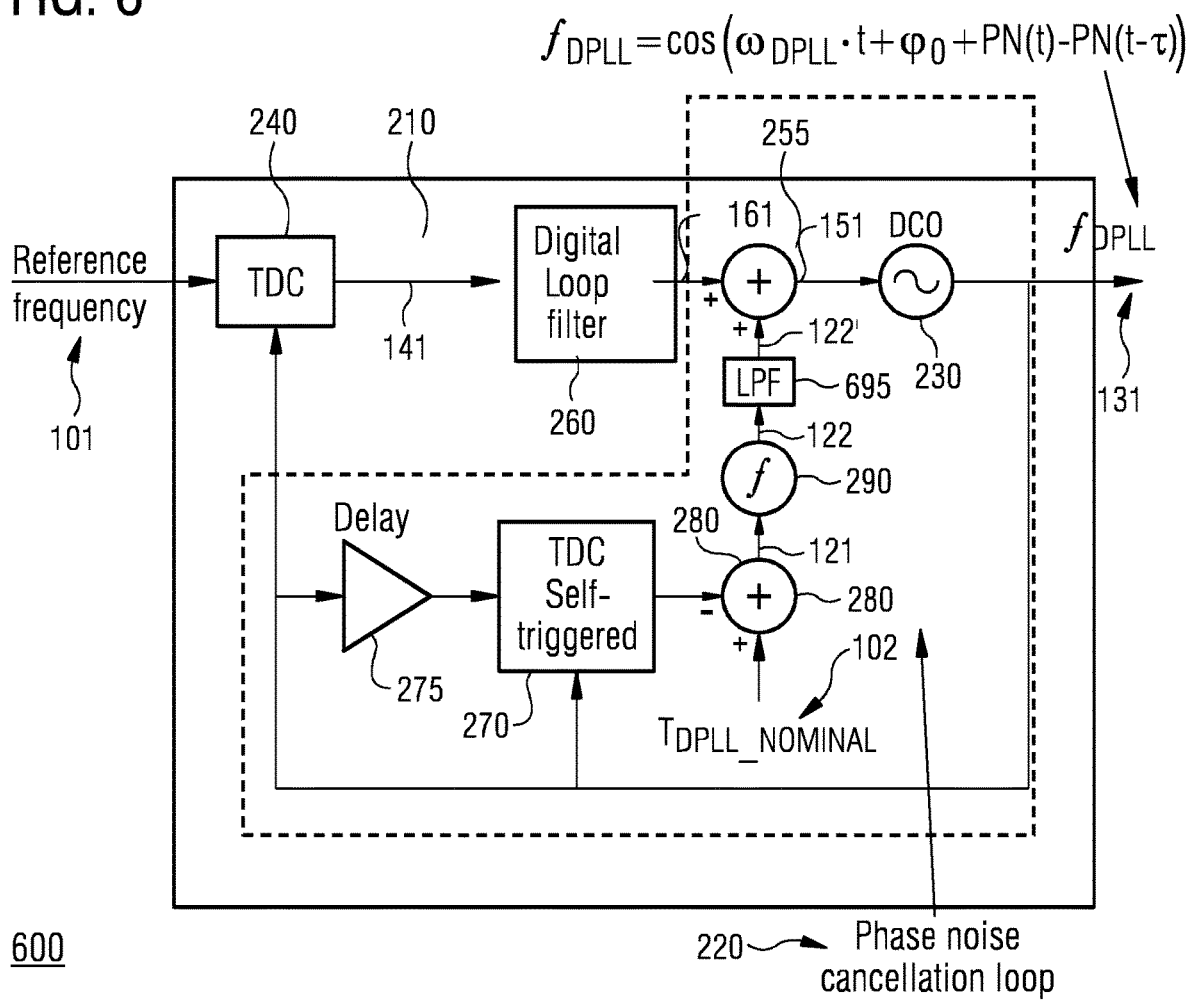
FIG. 6 illustrates another example of a PLL.

In the example of FIG. 9, it was assumed that the second loop 220 additionally comprises a filter for band-pass filtering the correction signal as illustrated in FIG. 6. The PLL 600 illustrated FIG. 6 is substantially equal to the PLL 200 illustrated in FIG. 2. However, the second loop 220 additionally comprises the filter 695 which is configured to band-pass filter the correction signal 122. For example, the filter 695 may be configured to low-pass filter the correction signal. Accordingly, an improved phase noise cancellation may be achieved due to the removal of high frequency components from the correction signal 122. The resulting filter correction signal 122' is the combined with the output signal 161 of the loop filter 260.

Figure 7:
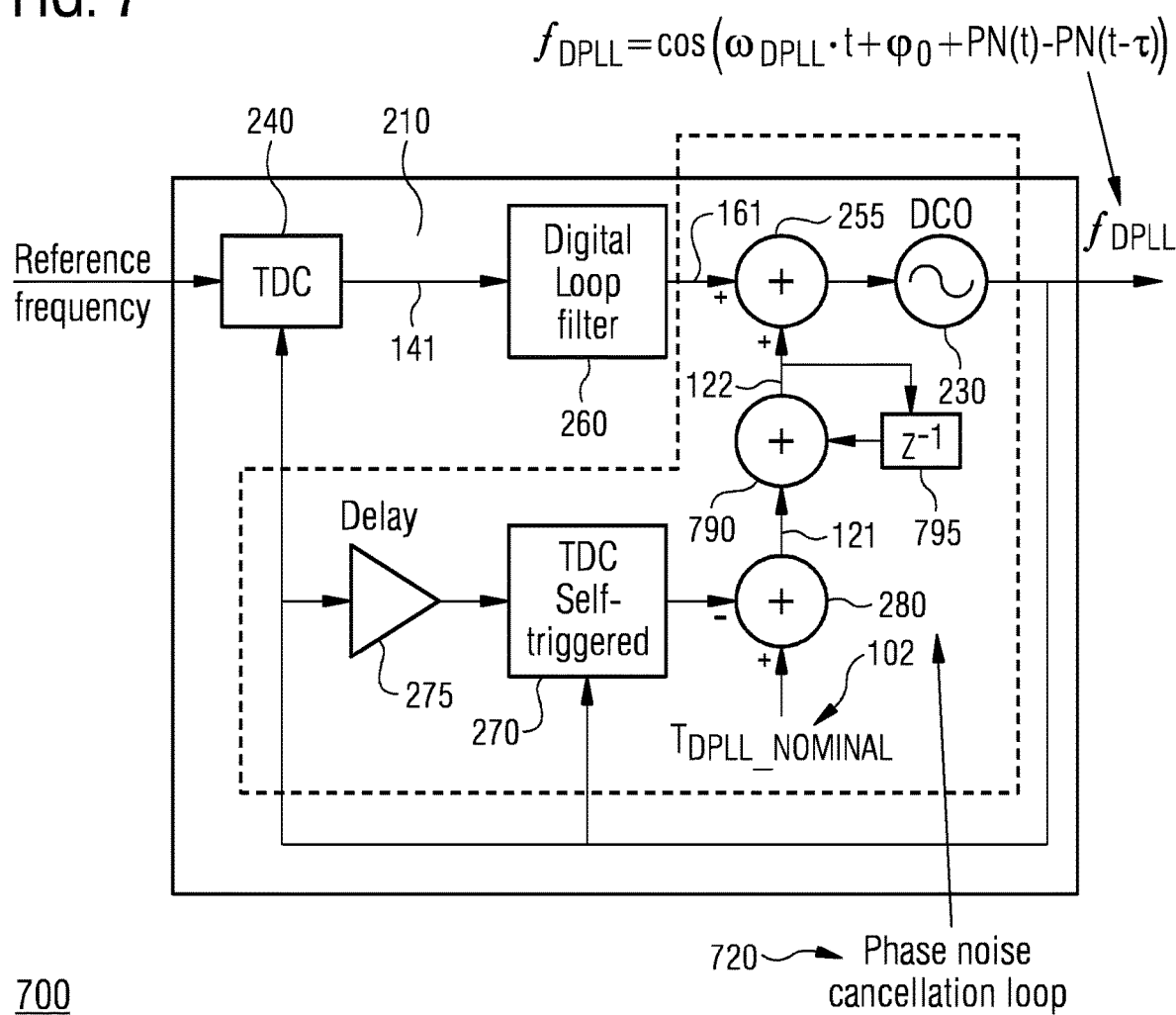
FIG. 7 illustrates still another example of a PLL.

A further alternative implementation of the second loop is illustrated in FIG. 7. The PLL 700 illustrated FIG. 7 is substantially equal to the PLL 200 illustrated in FIG. 2. However, the second loop 720 of PLL 700 comprises an additional combiner 790 instead of integrator 290. The combiner 790 is configured to generate a sample of the correction signal 122 by combining signal 121 indicative of the timing error of the oscillation signal 131's cycle time with a prior sample of the correction signal 122.

As indicated in FIG. 7, an additional delay element 795 may be coupled between an output and an input of the combiner 790 so that the second delay element 795 delays the prior sample of the correction signal 122 such that it may be combined with a current (succeeding) sample of the signal 121.

The first loop 210 of the PLLs described above may additionally comprise further elements of a conventional PLL (e.g. a frequency divider). Also, the DCO 230 may be replaced a VCO. In case, a VCO is used, the PLL may additionally comprise a Digital-to-Analog Converter (DAC). The DAC may, e.g., be arranged within the second loop 220 in order to convert the digital correction signal 122 into an analog representation. The analog correction signal may then be combined with the analog signal 161 from the loop filter of the first loop (i.e. the first loop is analog). Alternatively, the DAC may be arranged between the combiner 150 and the VCO so that the DAC converts the digital control signal 151 output by the combiner 250 to an analog control voltage for the VCO. Also practical functionalities like calibrations or spur cancelling may be added to the PLL. However, the basic principle of phase noise cancellation remains unchanged for these modified PLLs.

For all PLLs of the present disclosure, the phase noise is determined by the phase noise of the first loop, the quantization error of the self-triggered TDC and the phase noise cancellation delay.

An example of an implementation using a PLL according to one or more aspects of the proposed architecture or one or more examples described above is illustrated in FIG. 10. FIG. 10 schematically illustrates an example of a mobile device 1000 (e.g. mobile phone, smartphone, tablet-computer, or laptop) comprising a PLL 1010 according to an example described herein.

For example, a transmitter 1030 may comprise the PLL 1010. The transmitter 1030 may additionally comprise a mixing circuit (not illustrated) configured to up-convert a baseband transmit signal using a signal derived from the oscillation signal (as generated by the PLL 1010).

Alternatively or additionally, the mobile device 1000 may comprise a receiver 1040, which comprises the PLL 1010. The receive 1040 may additionally comprise a mixing circuit (not illustrated) configured to down-convert a radio frequency receive signal using a signal derived from the oscillation signal as generated by the PLL 1010).

In case, the mobile device 1000 comprises transmitter 1030 and receiver 1040, they may share a common PLL for generating the oscillation signal. The signals for their respective mixing circuits may, e.g., be derived from the PLL's oscillation signal by means of a frequency divider and/or one or more filter and delay circuits.

At least one antenna element 1020 of the mobile device 1000 may be coupled to the transmitter 1030, or to the receiver 1040.

To this end, a mobile device may be provided enabling transmit and/or receive signals with improved EVM due to the low noise oscillation signal provided by the PLL 1010.

The proposed PLL is not limited to mobile devices. The proposed PLL may be used in any electronic device for generating an oscillation signal with improved phase noise.

An example of a method 1100 for a PLL is illustrated by means of a flowchart in FIG. 11. The PLL comprises a first loop and a second loop, wherein the first loop comprises a controlled oscillator and a phase detector. The method 1100 comprises generating 1102, using the controlled oscillator, an oscillation signal and generating 1104, using the phase detector, a first signal indicative of a timing difference between a reference signal and the oscillation signal.

Further, the method 1100 comprises generating 1106, using the second loop, a second signal indicative of a timing error of the oscillation signal's cycle time. The method 1100 also comprises generating 1108, using the second loop, a correction signal based on the second signal. Additionally, the method 1100 comprises generating 1110 a control signal for the controlled oscillator by combining the correction signal and a third signal derived from the first signal.

More details and aspects of the method are mentioned in connection with the proposed concept or one or more examples described above (e.g. FIGS. 1-10). The method may comprise one or more additional optional features corresponding to one or more aspects of the proposed concept or one or more examples described above.

The examples as described herein may be summarized as follows:

Example 1 is a phase-locked loop, comprising: a first loop comprising a controlled oscillator and a phase detector, wherein the controlled oscillator is configured to generate an oscillation signal, and wherein the phase detector is configured to generate a first signal indicative of a timing difference between a reference signal and the oscillation signal; a second loop configured to generate, based on the oscillation signal, a second signal indicative of a timing error of the oscillation signal's cycle time, and to generate a correction signal based on the second signal; and a combiner configured to generate a control signal for the controlled oscillator by combining the correction signal and a third signal derived from the first signal.

In example 2, the controlled oscillator in the phase-locked loop of example 1 is configured to generate the oscillation signal based on the control signal.

In example 3, the second loop in the phase-locked loop of example 1 or example 2 comprises a time-to-digital converter configured to generate, based on the oscillation signal and a delayed replica of the oscillation signal, a fourth signal indicative of the oscillation signal's actual cycle time.

In example 4, a sampling frequency of the time-to-digital converter in the phase locked loop of example 3 is at least 20 times lower than an oscillation frequency of the oscillation signal.

In example 5, the second loop in the phase-locked loop of example 3 or example 4 further comprises a delay element configured to generate the delayed replica of the oscillation signal by delaying the oscillation signal.

In example 6, the second loop in the phase-locked loop of any of examples 3 to 5 further comprises a second combiner configured to generate the second signal by combining the fourth signal and a fifth signal indicative of a nominal cycle time of the oscillation signal.

In example 7, the second loop in the phase-locked loop of example 6 further comprises an integrator configured to generate the correction signal by continuously integrating the second signal.

In example 8, the second loop further in the phase-locked loop of example 6 comprises a third combiner configured to generate a sample of the correction signal by combining the second signal with a prior sample of the correction signal.

In example 9, the second loop in the phase-locked loop of example 8 further comprises a second delay element coupled between an output and an input of the third combiner, wherein the delay element is configured to delay the prior sample of the correction signal.

In example 10, the second loop in the phase-locked loop of any of examples 7 to 9 further comprises a filter configured to band-pass filter the correction signal.

In example 11, the first loop in the phase-locked loop of any of the preceding examples further comprises a loop filter configured to generate the third signal by filtering the first signal.

In example 12, the phase detector in the phase-locked loop of any of the preceding examples is a time-to-digital-converter.

In example 13, the controlled oscillator in the phase-locked loop of any of the preceding is a digitally controlled oscillator.

In example 14, the controlled oscillator in the phase-locked loop of any of examples 1 to 12 is a voltage controlled oscillator.

Example 15 is a transmitter comprising a phase-locked loop according to any of examples 1 to 14.

In example 16, the transmitter of example 15 further comprises a mixing circuit configured to up-convert a baseband transmit signal using a signal derived from the oscillation signal.

Example 17 is a receiver comprising a phase-locked loop according to any of examples 1 to 14.

In example 18, the receiver of example 17 further comprises a mixing circuit configured to down-convert a radio frequency receive signal using a signal derived from the oscillation signal.

Example 19 is a mobile device comprising at least one of a transmitter according to any of examples 15 and 16, and a receiver according to any of examples 17 and 18.

In example 20, the mobile device of example 19 further comprises at least one antenna element coupled to the transmitter, or to the receiver.

Example 21 is a method for a phase-locked loop comprising a first loop and a second loop, wherein the first loop comprises a controlled oscillator and a phase detector, the method comprising: generating, using the controlled oscillator, an oscillation signal; generating, using the phase detector, a first signal indicative of a timing difference between a reference signal and the oscillation signal; generating, using the second loop, a second signal indicative of a timing error of the oscillation signal's cycle time; generating, using the second loop, a correction signal based on the second signal; and generating a control signal for the controlled oscillator by combining the correction signal and a third signal derived from the first signal.

In example 22, generating the oscillation signal in the method of example 21 is based on the control signal.

In example 23, generating the second signal in the method of example 21 or example 22 comprises generating, based on the oscillation signal and a delayed replica of the oscillation signal, a fourth signal indicative of the oscillation signal's actual cycle time.

In example 24, generating the second signal in the method of example 23 further comprises generating the delayed replica of the oscillation signal by delaying the oscillation signal.

In example 25, generating the second signal in the method of example 23 or example 24 further comprises combining the fourth signal and a fifth signal indicative of a nominal cycle time of the oscillation signal.

In example 26, generating the correction signal in the method of example 25 further comprises continuously integrating the second signal.

In example 27, generating the correction signal in the method of example 25 further comprises generating a sample of the correction signal by combining the second signal with a prior sample of the correction signal.

In example 28, generating the correction signal in the method of example 26 or example 27 further comprises band-pass filtering the correction signal.

In example 29, the method of any of the preceding examples further comprises generating the third signal by filtering the first signal.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A phase-locked loop, comprising:
   a first loop comprising a controlled oscillator and a phase detector, wherein the controlled oscillator is configured to generate an oscillation signal, and wherein the phase detector is configured to generate a first signal indicative of a timing difference between a reference signal and the oscillation signal;
   a second loop configured to generate, based on the oscillation signal, a second signal indicative of a timing error of the oscillation signal's cycle time, and to generate a correction signal based on the second signal; and
   a combiner configured to generate a control signal for the controlled oscillator by combining the correction signal and a third signal derived from the first signal,
   wherein the second loop comprises:
   a time-to-digital converter configured to generate, based on the oscillation signal and a delayed replica of the oscillation signal, a fourth signal indicative of the oscillation signal's actual cycle time.

2. The phase-locked loop of claim 1, wherein the controlled oscillator is configured to generate the oscillation signal based on the control signal.

3. The phase locked loop of claim 1, wherein a sampling frequency of the time-to-digital converter is at least 20 times lower than an oscillation frequency of the oscillation signal.

4. The phase-locked loop of claim 1, wherein the second loop further comprises:
   a delay element configured to generate the delayed replica of the oscillation signal by delaying the oscillation signal.

5. The phase-locked loop of claim 1, wherein the second loop further comprises:
   a second combiner configured to generate the second signal by combining the fourth signal and a fifth signal indicative of a nominal cycle time of the oscillation signal.

6. The phase-locked loop of claim 5, wherein the second loop further comprises:
   an integrator configured to generate the correction signal by continuously integrating the second signal.

7. The phase-locked loop of claim 5, wherein the second loop further comprises:
   a third combiner configured to generate a sample of the correction signal by combining the second signal with a prior sample of the correction signal.

8. The phase-locked loop of claim 7, wherein the second loop further comprises:
   a second delay element coupled between an output and an input of the third combiner, wherein the delay element is configured to delay the prior sample of the correction signal.

9. The phase-locked loop of claim 6, wherein the second loop further comprises:
   a filter configured to band-pass filter the correction signal.

10. The phase-locked loop of claim 1, wherein the first loop further comprises a loop filter configured to generate the third signal by filtering the first signal.

11. The phase-locked loop of claim 1, wherein the phase detector is a time-to-digital-converter.

12. The phase-locked loop of claim 1, wherein the controlled oscillator is a digitally controlled oscillator.

13. The phase-locked loop of claim 1, wherein the controlled oscillator is a voltage controlled oscillator.

14. A transmitter comprising a phase-locked loop according to claim 1.

15. The transmitter of claim 14, further comprising:
   a mixing circuit configured to up-convert a baseband transmit signal using a signal derived from the oscillation signal.

16. A receiver comprising a phase-locked loop according to claim 1.

17. The receiver of claim 16, further comprising:
   a mixing circuit configured to down-convert a radio frequency receive signal using a signal derived from the oscillation signal.

18. A method for a phase-locked loop comprising a first loop and a second loop, wherein the first loop comprises a controlled oscillator and a phase detector, the method comprising:
   generating, using the controlled oscillator, an oscillation signal;
   generating, using the phase detector, a first signal indicative of a timing difference between a reference signal and the oscillation signal;

generating, using the second loop, a second signal indicative of a timing error of the oscillation signal's cycle time;

generating, using the second loop, a correction signal based on the second signal; and generating a control signal for the controlled oscillator by combining the correction signal and a third signal derived from the first signal wherein generating the second signal comprises generating, based on the oscillation signal and a delayed replica of the oscillation signal, a fourth signal indicative of the oscillation signal's actual cycle time.

19. The method of claim 18, wherein generating the oscillation signal is based on the control signal.

20. The method of claim 18, wherein generating the second signal further comprises generating the delayed replica of the oscillation signal by delaying the oscillation signal.

21. The method of claim 18, wherein generating the second signal further comprises combining the fourth signal and a fifth signal indicative of a nominal cycle time of the oscillation signal.

22. The method of claim 21, wherein generating the correction signal further comprises continuously integrating the second signal.

23. The method of claim 21, wherein generating the correction signal further comprises:

generating a sample of the correction signal by combining the second signal with a prior sample of the correction signal.

* * * * *